United States Patent [19]

Hacskaylo

[11] Patent Number: 4,646,120

[45] Date of Patent: Feb. 24, 1987

[54] PHOTODIODE ARRAY

[75] Inventor: Michael Hacskaylo, Falls Church, Va.

[73] Assignee: The United States of America as represented by the Secretary of the Army, Washington, D.C.

[21] Appl. No.: 714,423

[22] Filed: Mar. 21, 1985

[51] Int. Cl.⁴ .................. H01L 27/14; H01L 31/00
[52] U.S. Cl. ...................................... 357/30; 357/16; 357/32; 357/55
[58] Field of Search .................. 357/30, 32, 16, 61, 357/63, 55, 30 D, 30 E, 30 F, 30 H, 30 J, 65, 45

[56]  References Cited

U.S. PATENT DOCUMENTS

| 4,197,141 | 4/1980 | Bozler et al. | 357/30 |
| 4,376,659 | 3/1983 | Castro | 357/16 |
| 4,494,133 | 1/1985 | Dean et al. | 357/30 |

Primary Examiner—James W. Davie
Assistant Examiner—Georgia Y. Epps
Attorney, Agent, or Firm—Max L. Harwell; John E. Holford; Anthony T. Lane

[57]  ABSTRACT

A photodiode array structure and method of fabrication is provided. The array is fabricated on a substrate as a multilayer structure with a novel combination of different type layers and then separated into optically independent diodes by delineation of the diodes. A novel array with heterojunction diodes for far-infrared is specifically disclosed.

9 Claims, 2 Drawing Figures

PHOTODIODE ARRAY

The invention described herein may be manufactured, used, and licensed by the U.S. Government for governmental purposes without the payment of any royalties thereon.

BACKGROUND OF THE INVENTION

1. Field of the Invention

This invention relates to radiant energy sensors particularly integrated circuit semiconductor photodiode arrays wherein individual diodes serve as detectors of individual picture elements within a thermal or far-infrared image.

2. Description of the Prior Art

Of the numerous devices that have been used for the detection of radiant electromagnetic energy one of the most promising, particularly for far-infrared array structures, at the present time are semiconductor photodiodes. These can operate in the photovoltaic mode with no external bias, but they perform better when back-biased to form a depletion region close to the pn junction. For example, semiconductor materials consisting of certain elements from Groups III A and V A or preferably VI A and II B provide the required bandgap energies for infrared detectors when doped with certain elements from Group V A (p-type) or Group III A (n-type).

To form a photodiode array it has been the practice to deposit a thin two layer p-n semiconductor photodiode having a large surface area on a thick substrate of suitable characteristics. This area is then divided into smaller areas which form picture elements or pixels, e.g. one such array has 512 rows and 512 columns with more than 250,000 elements in a square array. The pixels were formed by delineation of the p-n layer and then each was contacted by depositing a small metal electrode in the middle of each pixel on one layer of the diode, and a metal common return contact on the other layer. The substrate is formed of a material transparent to the far-infrared radiation, which passes therethrough to be absorbed in the adjacent photocurrent generating layer of the diode.

The theory of operations was that the signal obtained by loading a specific probe contact was determined only by those photocurrents nearer to it then to another adjacent contact. This turned out not to be the case and to reduce the effect of other photocurrents grooves were cut through the cap contact layer of the diode on which the probe contacts were deposited. These grooves, which extend from one edge to the opposite edge of the contact layer and between the rows and columns of contacts, created separate islands mostly above the pn boundary and somewhat reduced the cross-talk between adjacent pixel detectors. The photocurrent generating layer was kept substantially intact to form with the metal return contact the return current electrode for all of the detectors. Unfortunately, it is in this layer that most of the cross-talk between photocurrents takes place and was little affected by the isolation techniques described above.

SUMMARY OF THE INVENTION

The present invention relates to an improved array of photodiodes and its method of manufacture, which is highly compatible with existing circuit integration processes and provides minimum cross-talk between diodes. The teachings are particularly advantageous for heterojunction photodiodes but not limited thereto.

DESCRIPTION OF THE PREFERRED EMBODIMENTS

Figure 1:
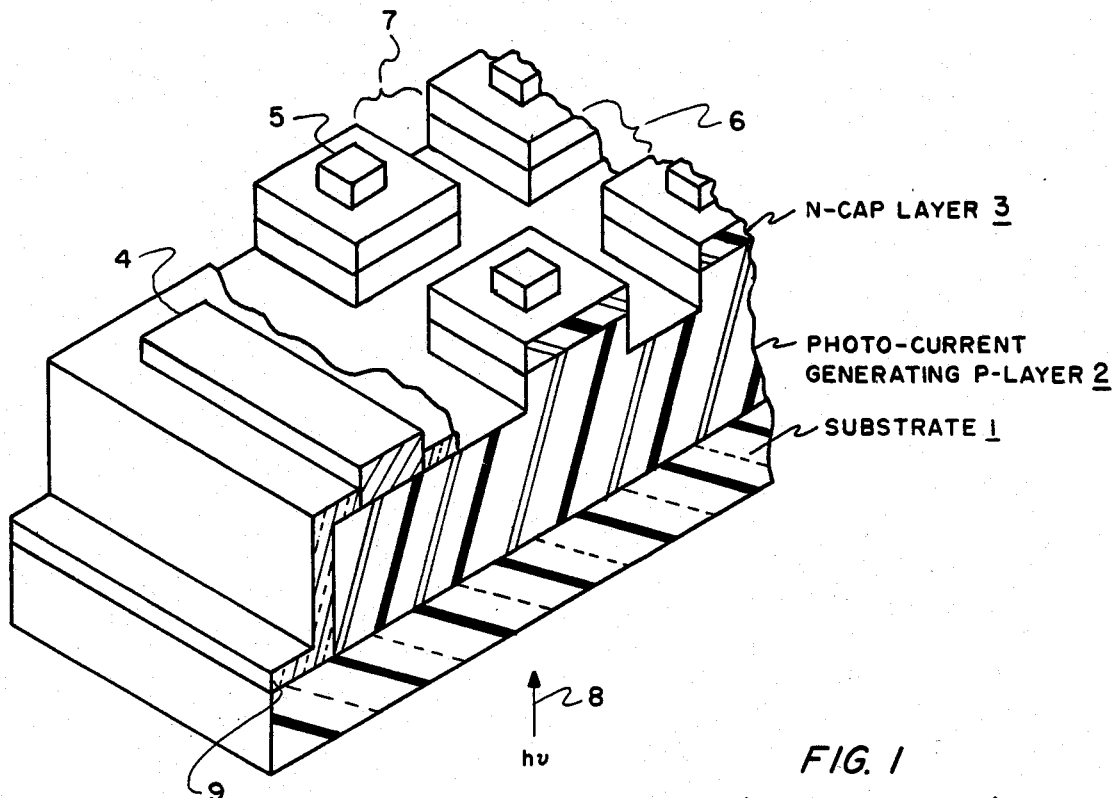
FIG. 1 shows a prior art detector array to which the teachings of this patent apply.

As a further aid in understanding the advantages of the present invention an example of the prior art devices previously described is shown in FIG. 1. The device is fabricated on a substrate 1 of material transparent to the band of radiation to be detected. A layer 2 of doped semiconductor, e.g. p-type, having bandgap energies which result in absorption of this radiation is formed by a suitable epitaxial technique on one surface of the substrate. A second layer 3 of n-type semiconductor is formed on most of the surface of the first layer leaving a relatively small surface portion exposed to receive a common metal contact 4. An array of individual metal probe contacts 5 arranged in rows and columns are deposited through an appropriate mask on the exposed surface of layer 3. Grooves such as 6 and 7 are then formed through layer 3 between every adjacent row and column of the contact array dividing layer 3 into pixels of n-type material. The grooves also penetrate slightly into layer 2 through the p-n junction, but not enough to change the lateral conductance of the layer. When an image is projected through the substrate photocurrents are generated in layer 2. The image is recovered in electronic form by periodically sampling the voltages induced in each diode by these photocurrents. Such voltages are strongly dependent on the proximity of the photocurrent to the pixel, but as pointed out previously, it is preferred that only the photocurrents directly below each pixel contribute to its induced voltage.

Figure 2:
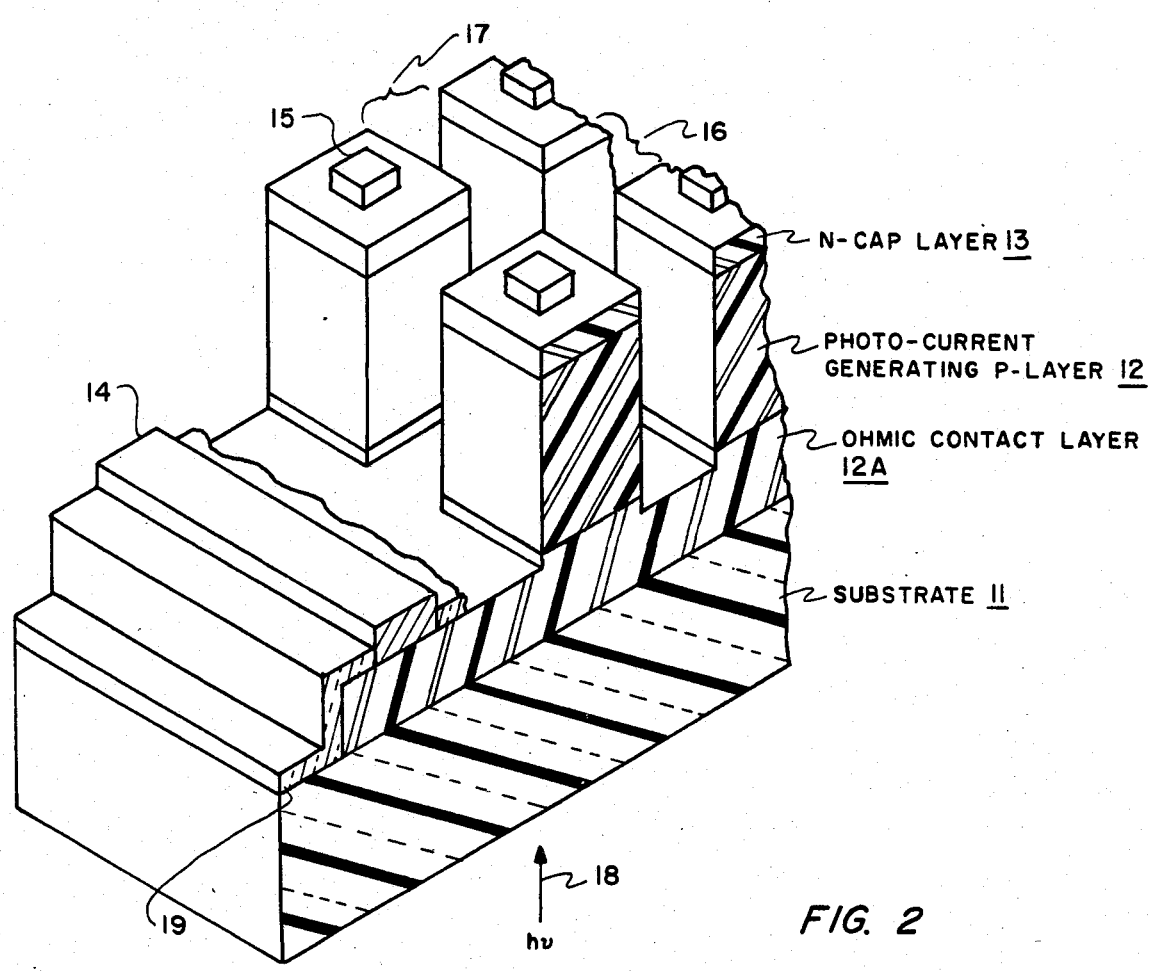
FIG. 2 shows a novel detector array according to the present invention.

FIG. 2 shows a preferred embodiment of an array structure according to the present invention. This device also begins with a thick substrate II of material transparent to radiation in a selected band of electromagnetic radiation. For example, to pass the band of wavelengths between 8 and 12 microns, the material may be a compound of elements from columns IIB and VIA of the periodic table, such as cadmium-telluride or cadmium-zinc-telluride. This element is typically 20 mils thick with a surface area of a quarter square inch or more. One surface of the substrate is covered with a thin layer 12A of semiconductor with a lattice structure compatible with that of the substrate and the materials of which the photodiode is to be fabricated. The semiconductor for layer 12A is chosen to be transparent to the selected radiation band and doped to high conductivity with an appropriate impurity. A suitable diode material for far infrared and the specific substrate above is also a compound of elements from columns IIB and VIA of the periodic table such as mercury-cadmium telluride. With the materials cited above, the formulation of layer 12A may be $Hg_{.7}Cd_{.3}Te$ doped to a concentration of $10^{17}$ to $10^{18}$ cm$^{-3}$ of an element from column VA of the period table such as As or Sb. The above p-type ohmic contact layer ranges from 5 to 8 microns in thickness and has a bandgap too large to readily absorb radiation in the selected operating band.

Thus modified the substrate is ready to receive the photodiodes.

The photodiodes can preferably be deposited by the same method as used with the ohmic contact layer 12A. Liquid epitaxy is presently preferred, but gas epitaxy, ion implantation or other well known methods can also be employed. The semiconductor chosen for the current generating layer 12 of the diode, which is deposited directly on layer 12A, is chosen to be highly absorptive in the selected radiation band and to be of the same conductivity type as layer 12A. The doping level is chosen to maximize photocurrent generation and generally will be much lower than layer 12A. With the substrate and ohmic contact layer given above the photocurrent layer 12 is preferably a p-type formulation of elements as used in layer 12A; such as $Hg_{.8}Cd_{.2}Te$ doped between $5 \times 10^{15}$ to $5 \times 10^{16}$ cm$^{-3}$ with As or Sb. Layer 12 is about 10 to 15 microns thick to provide an adequate interaction region for incident photons 18, which region is fairly well limited to the portion of layer 12 between the boundary of the depletion zone around the pn interface and the nearest surface of layer 12A.

The junction cap layer electrode 13 which completes the dode is formed from a high energy bandgap semiconductor which is transparent to the selected band of radiation and doped with an impurity from column IIIA of the periodic table which produces an opposite polarity of current carriers from those of layers 12 and 12A. A suitable n-type formulation for the junction contact cap layer 13 is $Hg_{.7}Cd_{.3}Te$ doped between $10^{15}$ and $5 \times 10^{15}$ cm$^{-3}$ with indium, gallium or thallium. Layer 13 wherein photon interactions are counterproductive is only about 1 to 2 microns thick. Layers 12 and 13 preferably are deposited on the entire surface of layer 12A and delineated as described before. An exposed surface area on layer 12A is needed to deposit a metal return contact 14. Probe contacts 15 may be deposited using an appropriate mask or any equivalent means.

Since this structure has the ohmic contact base layer 12A, not present in the prior art, it is feasible to mill two orthogonal series of parallel grooves such as 16 and 17 entirely through layers 12 and 13 between the rows and columns of probe contacts 15 and even to a very limited extent into layer 12A. This completely isolates the photocurrents induced in layer 12 as well as the storage processes taking place in layer 13. The milling is preferably done with one or more ion beams, but chemical etching techniques are also used. It is customary in both the prior art array and in the present invention to deposit a passivating layer 9 or 19, e.g. silicon monoxide, silicon dioxide, or zinc sulfide over the exposed semiconductor layer surfaces of the finished array overlapping the substrate slightly to seal out contaminants, and this may be done in the present case.

Obviously other semiconductor materials will be used at selected wavelength bands other than 8-12 microns. The present invention is particularly advantageous in heterojunction devices of the type described above, where most of the radiation is absorbed in the photo-current generating layer by a lower bandgap material, but it will be obvious to those skilled in the art that homojunction devices will also be greatly improved by these teachings.

I claim:

1. In an image detector system having an array of diode detectors, sensitive to light in a given frequency band, mounted on a thick high resistance substrate transparent to light in said band; the improvement wherein:

said array comprises three thin superposed coextensive layers of epitaxially grown semiconductive material doped to provide a different conductivity in each of said layers;

the second or center layer of said three layers being formulated to provide energy-band gaps which highly absorb energy in said selected band thereby generating therein a high density of photocurrent in response to said radiation;

a first or top layer of said three layers doped to provide current carriers having a conductivity opposite to said second layer, thereby forming a photodiode;

a third or bottom layer of said three layers doped to have the same conductivity type but greater conductivity than said second layer thereby providing good ohmic contact between all points on the adjacent surface of said second layer;

said first and third layers being formulated to be transparent to energy in said selected band, and each having a broad surface spaced from said second layer;

an array of equally spaced ohmic metal contacts arranged in rows and columns attached to said broad surface of said first layer; and said three layers defining at least two series of grooves with a groove between every adjacent parallel pair of said rows and columns of said contacts, the grooves in different series intersecting, and said grooves penetrating the full depth of said first and second layers plus a very small fraction of said third layer, whereby said contacts are mounted on isolated portions of said first and second layers connected only through said third layer.

2. An array according to claim 1 wherein:

said selected band includes wavelengths between 8 and 12 microns.

3. An array according to claim 1 wherein:

said layers consist elements from Groups II B, VI A, V A and III A of the Periodic Table.

4. An array according to claim 1 wherein:

said substrate consists of cadmium-telluride.

5. An array according to claim 1 wherein:

said substrate consists of cadmium-zinc-telluride.

6. An array according to claim 4 wherein:

said first layer is n-type doped to between $10^{15}$ and $5 \times 10^{15}$ (cm$^{-3}$) with an impurity element chosen from the elements in Group III A of the Periodic Table.

7. An array according to claim 6 wherein:

said second layer is p-type doped between $5 \times 10^{15}$ and $5 \times 10^{16}$ (cm$^{-3}$) with an impurity chosen from the elements in Group V A of the Periodic Table of Elements.

8. An array according to claim 7 wherein:

said first and second layers are mercury-cadmium telluride doped with an impurity chosen from the elements in Groups III A and V A of the Periodic Table, respectively.

9. An image detecting array according to claim 1 wherein:

said array contains at least one series of at least 500 grooves.

* * * * *